(12) United States Patent
Noh

(10) Patent No.: US 9,064,831 B2
(45) Date of Patent: Jun. 23, 2015

(54) ORGANIC LIGHT-EMITTING DISPLAY APPARATUS

(71) Applicant: Samsung Display Co., Ltd., Yongin, Gyeonggi-Do (KR)

(72) Inventor: Seung-Peom Noh, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/061,606

(22) Filed: Oct. 23, 2013

(65) Prior Publication Data

US 2015/0014635 A1    Jan. 15, 2015

(30) Foreign Application Priority Data

Jul. 12, 2013    (KR) ........................ 10-2013-0082445

(51) Int. Cl.
| H01L 29/08 | (2006.01) |
| H01L 35/24 | (2006.01) |
| H01L 51/00 | (2006.01) |
| H01L 29/04 | (2006.01) |
| H01L 29/10 | (2006.01) |
| H01L 31/00 | (2006.01) |
| H01L 27/14 | (2006.01) |
| H01L 29/15 | (2006.01) |
| H01L 31/036 | (2006.01) |
| H01L 27/32 | (2006.01) |
| H01L 51/56 | (2006.01) |

(52) U.S. Cl.
CPC ............ *H01L 27/3272* (2013.01); *H01L 51/56* (2013.01)

(58) Field of Classification Search
CPC ............................ H01L 27/3272; H01L 51/56
USPC ................ 257/40, 59, 72, E51.018, E51.019, 257/E51.02
See application file for complete search history.

(56) References Cited

U.S. PATENT DOCUMENTS

| 7,838,346 | B2 * | 11/2010 | Tokunaga ...................... 438/149 |
| 7,868,327 | B2 * | 1/2011 | Jeong et al. ...................... 257/59 |
| 8,330,221 | B2 * | 12/2012 | Tanaka ........................... 257/347 |
| 8,399,329 | B2 * | 3/2013 | Jinbo et al. ..................... 438/311 |
| 8,465,992 | B2 * | 6/2013 | Kim et al. ......................... 438/26 |
| 8,766,271 | B2 * | 7/2014 | Kim et al. ......................... 257/72 |
| 2008/0303408 | A1 * | 12/2008 | Yamazaki et al. ............. 313/498 |
| 2012/0187388 | A1 * | 7/2012 | Yamazaki et al. ............... 257/40 |
| 2012/0286312 | A1 * | 11/2012 | Hatano et al. .................... 257/98 |
| 2013/0009289 | A1 * | 1/2013 | Arai et al. ...................... 257/664 |
| 2013/0140547 | A1 * | 6/2013 | Lee et al. ......................... 257/40 |
| 2013/0175534 | A1 * | 7/2013 | Chung et al. ..................... 257/66 |

(Continued)

FOREIGN PATENT DOCUMENTS

| JP | 2004-042412 | 2/2004 |
| KR | 100922951 B | 10/2009 |

(Continued)

*Primary Examiner* — Ida M Soward
(74) *Attorney, Agent, or Firm* — Knobbe, Martens, Olson & Bear LLP

(57) ABSTRACT

An organic light-emitting display apparatus and a fabrication method thereof are disclosed. The organic light-emitting display apparatus may include, for example, a flexible substrate, a plurality of barrier layers formed on the flexible substrate, a thin film transistor (TFT) formed on the barrier layers, the TFT including a semiconductor active layer, and at least one thermal emission layer formed between the barrier layers, an organic light-emitting device (OLED) electrically connected to the TFT, formed on the barrier layers, and an encapsulation portion encapsulating the OLED.

9 Claims, 7 Drawing Sheets

(56) References Cited

U.S. PATENT DOCUMENTS

2013/0228763 A1* 9/2013 Yamazaki et al. ............... 257/40
2014/0021499 A1* 1/2014 Jang ................................ 257/98
2014/0055028 A1* 2/2014 Yi et al. ......................... 313/498
2014/0055924 A1* 2/2014 Baek et al. ............... 361/679.01

FOREIGN PATENT DOCUMENTS

| KR | 1020120078316 A | 7/2010 |
| KR | 1020100124012 A | 11/2010 |
| KR | 101148144 B | 5/2012 |

* cited by examiner

ORGANIC LIGHT-EMITTING DISPLAY APPARATUS

RELATED APPLICATIONS

Any and all applications for which a foreign or domestic priority claim is identified in the Application Data Sheet as filed with the present application are hereby incorporated by reference under 37 CFR 1.57. For example, this application claims the benefit of Korean Patent Application No. 10-2013-0082445, filed on Jul. 12, 2013, in the Korean Intellectual Property Office, the disclosure of which is incorporated herein in its entirety by reference.

BACKGROUND

1. Field

The present disclosure relates to an organic light-emitting display apparatus including a flexible substrate and a fabrication method thereof.

2. Description of the Related Technology

Generally, an organic light-emitting display apparatus including a thin film transistor (TFT) is implemented in mobile display devices, such as smart phones, digital cameras, video cameras, camcorders, and digital assistants, or in electronic electrical goods, such as ultra-thin televisions (TVs), ultra-slim notebooks, tablet personal computers (PCs), and flexible display apparatuses. An organic light-emitting display apparatus includes a first electrode and a second electrode formed on a substrate, and an intermediate layer interposed between the first electrode and the second electrode. The organic light-emitting display apparatus has superior characteristics such as wide viewing angles, excellent contrast, and comparatively shorter response times.

Recently, portable flexible display devices that may be applied to apparatuses of various shapes have drawn attention as next generation display devices. Among these, a flexible display device based on the organic light-emitting device technology has been highlighted as the most prominent display device. The flexible display device has various thin films formed on a flexible substrate. If a thermal process is performed on the thin film, the heat applied to the thin film is transmitted to the flexible substrate, which may damage the flexible substrate. Thus, there is a need to minimize this damage to the flexible substrate due to heat.

SUMMARY OF CERTAIN INVENTIVE ASPECTS

In one aspect, an organic light-emitting display apparatus including a thermal emission layer for preventing damage to a flexible substrate due to heat, and a fabrication method thereof are provided. Additional aspects will be set forth in part in the description which follows and, in part, will be apparent from the description, or may be learned by practice of the presented embodiments.

In another aspect, an organic light-emitting display apparatus including a flexible substrate is provided. The organic light-emitting display apparatus may further include, for example, a plurality of barrier layers formed on the flexible substrate, a thin film transistor (TFT) formed on the barrier layers and including a semiconductor active layer, at least one thermal emission layer formed between the barrier layers, an organic light-emitting device (OLED) formed on the barrier layers, the OLED electrically connected to the TFT, and an encapsulation portion encapsulating the OLED.

In some embodiments, the at least one thermal emission layer includes a transparent conductive layer. In some embodiments, the at least one thermal emission layer includes a transparent oxide semiconductor. In some embodiments, the at least one thermal emission layer includes a metal thin film. In some embodiments, the plurality of barrier layers are formed in a perpendicular direction to the flexible substrate, with gap distances therebetween, and the at least one thermal emission layer is interposed between the gap distances between the barrier layers. In some embodiments, the barrier layers and the thermal emission layer directly contact each other. In some embodiments, the barrier layers are formed over an entire area of the flexible substrate, and the at least one thermal emission layer has at least the same size as the barrier layers. In some embodiments, the flexible substrate is formed of a transparent material. In some embodiments, the barrier layers include an inorganic layer.

In another aspect, a method of fabricating an organic light-emitting display apparatus is provided. The method may include, for example, preparing a carrier substrate, forming a flexible mother-substrate having a size sufficient for accommodating a plurality of organic light-emitting display apparatuses formed in individual units on the carrier substrate, forming first barrier layers covering the flexible mother-substrate, forming a thermal emission layer covering the first barrier layers, forming second barrier layers on the thermal emission layer, and irradiating a laser beam on a semiconductor active layer.

In some embodiments, the forming of the flexible mother-substrate includes forming the flexible substrate by coating a material for a flexible substrate on the carrier substrate. In some embodiments, the first barrier layers include an inorganic layer. In some embodiments, the thermal emission layer is formed to be wider than the barrier layers. In some embodiments, between a boundary of the barrier layers and a boundary of the carrier substrate an externally exposed thermal emission region is formed. In some embodiments, the thermal emission layer extends from an upper portion of the barrier layers to the thermal emission region. In some embodiments, the thermal emission layer entirely covers the thermal emission region. In some embodiments, the thermal emission layer is patterned so as to include at least a portion of the thermal emission region. In some embodiments, the thermal emission layer is formed by depositing any one of a transparent conductive layer, a transparent oxide semiconductor, or a metal thin film, on the substrate. In some embodiments, the irradiating of the laser beam includes performing a dehydrogenation process on the semiconductor active layer by irradiating a first laser beam onto the semiconductor active layer; and crystallizing the semiconductor active layer by irradiating a second laser beam onto the semiconductor active layer that is dehydrogenated. In some embodiments, after the irradiating of the laser beam, the method may further include forming a thin film transistor (TFT) and an organic light-emitting device (OLED) electrically connected to the TFT, on the flexible mother-substrate, forming an encapsulating portion encapsulating the OLED, separating the carrier substrate and the flexible mother-substrate, and dividing individually a plurality of organic light-emitting display apparatuses formed on the flexible mother-substrate. In some embodiments, the first barrier layers or the second barrier layers are formed as multiple layers, and the thermal emission layer is selectively formed between the multiple layers.

BRIEF DESCRIPTION OF THE DRAWINGS

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus, system or method according to some of the described embodiments can have several aspects, no single one of which necessarily is solely responsible for the desirable attributes of the apparatus, system or method. After considering this discussion, and particularly after reading the section entitled "Detailed Description of Certain Inventive Embodiments" one will understand how illustrated features serve to explain certain principles of the present disclosure.

FIG. 3A is a cross-sectional view illustrating a state after a carrier substrate is prepared.

DETAILED DESCRIPTION OF CERTAIN INVENTIVE EMBODIMENTS

Figure 1:
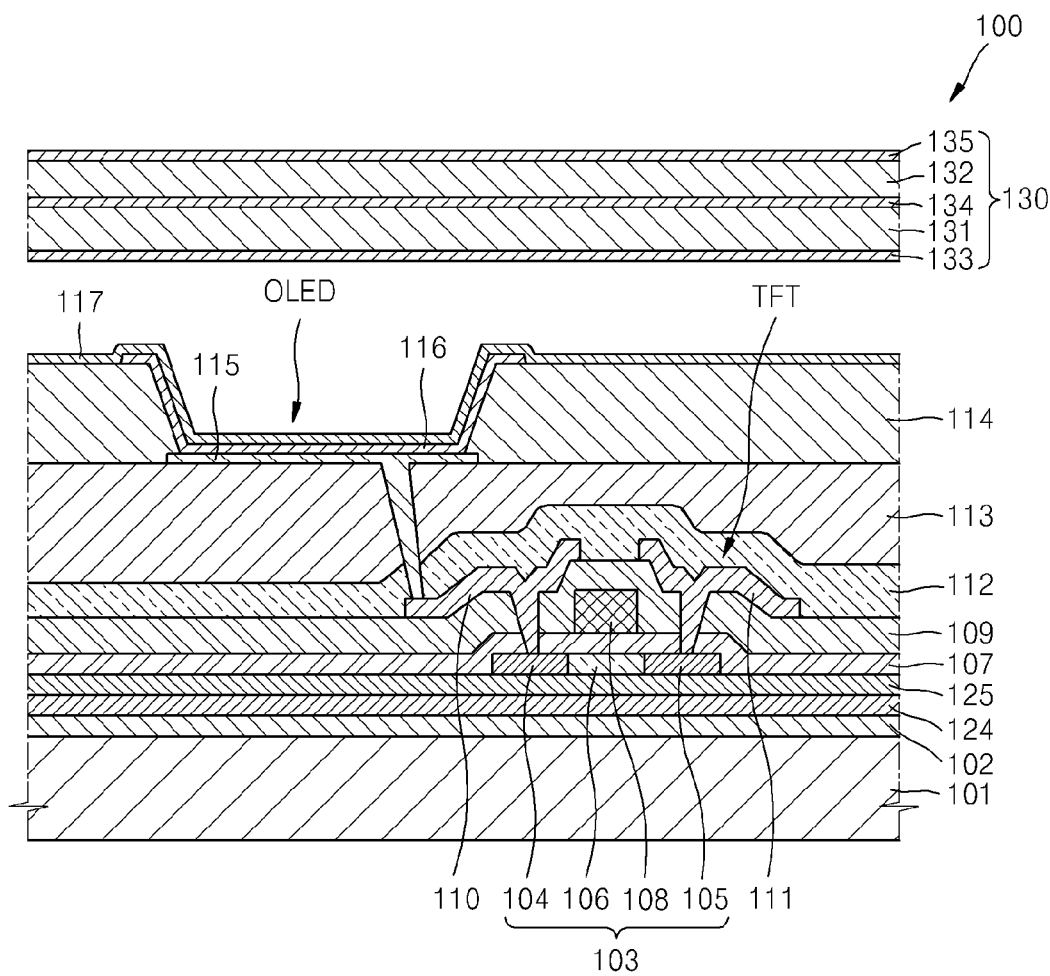
FIG. 1 is a cross-sectional view of sub-pixels of an organic light-emitting display apparatus.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Hereinafter, one or more embodiments of the present disclosure will be described more fully with reference to the accompanying drawings.

Figure 2:
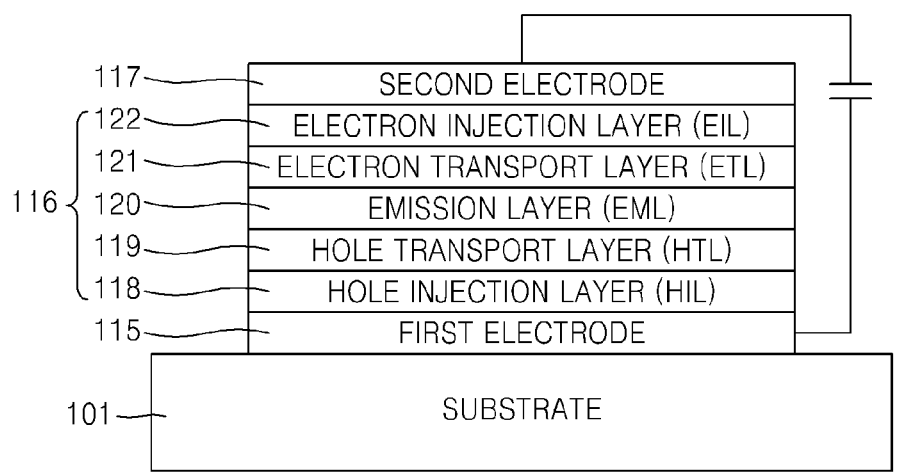
FIG. 2 is a block diagram illustrating an organic light-emitting device (OLED) of the light-emitting display apparatus of FIG. 1.

FIG. 1 is a cross-sectional view of sub-pixels of an organic light-emitting display apparatus according to an embodiment of the present disclosure. FIG. 2 is a block diagram illustrating an organic light-emitting device (OLED) of FIG. 1. Here, the sub-pixels have at least one thin film transistor (TFT) and one OLED. The structure of the TFT is not limited to what is illustrated in FIG. 1, but may be realized in various alterations in terms of its number and structure. Referring to FIGS. 1 and 2, the organic light-emitting display apparatus 100 has a flexible substrate 101. The flexible substrate 101 may be formed of a flexible insulating material. For example, the flexible substrate 101 may be formed of a high molecular weight material, such as polyimide (PI), polycarbonate (PC), polyethersulphone (PES), polyethylene terephthalate (PET), polyethylenenaphthalate (PEN), polyarylate (PAR), and fiber glass reinforced plastic (FRP). The flexible substrate 101 may be transparent, semi-transparent, or non-transparent.

Since moisture or oxygen may easily pass through the flexible substrate 101, compared to a glass substrate, it may deteriorate an organic emission layer that is vulnerable to moisture or oxygen, so that the life of the OLED may be reduced. To prevent this, first barrier layers 102 are formed on the flexible substrate 101. The first barrier layers 102 entirely cover an upper surface of the first flexible substrate 101. The first barrier layers 102 include an inorganic layer. For example, the first barrier layers 102 may be formed of any one selected from silicon oxide (SiOx), silicon nitride (SiNx), silicon oxynitride (SiON), aluminum oxide (AlO), and aluminum nitride (AlON). The first barrier layers 102 may be formed as a single layer or multiple layers.

A thermal emission layer 124 is formed on the first barrier layers 102. The thermal emission layer 124 entirely covers an upper surface of the first barrier layers 102. The thermal emission layer 124 will be described in detail later on. Second barrier layers 125 are formed on the thermal emission layer 124. The second barrier layers 125 may be formed of the same material as the first barrier layers 102. That is, the second barrier layers 125 include an inorganic layer, such as silicon oxide, silicon nitride, or metal oxide. The TFT is formed on the second barrier layers 125. Although the TFT according to the embodiment of the present disclosure exemplifies a top gate type TFT, other types of TFT, such as a bottom gate type TFT may also be included. A semiconductor active layer 103 is formed on the second barrier layers 125. When the semiconductor active layer 103 is formed of polysilicon, amorphous silicon is formed and crystallized into polysilicon.

A crystallization method of amorphous silicon may include various methods, such as rapid thermal annealing (RTA), solid phase crystallization (SPC), excimer laser annealing (ELA), metal-induced crystallization (MIC), metal-induced lateral crystallization (MILC), or sequential lateral solidification (SLS). However, to apply the flexible substrate 101 according to the present embodiment, methods that do not require a high temperature thermal process may be used. For example, when crystallizing by low temperature polysilicon (LTPS), the crystallization is performed by irradiating a laser, for a short time, to activate the semiconductor active layer 103. Thus, the time in which the flexible substrate 101 is exposed to a high temperature, for example, a temperature that is 450° C. or higher, may be minimized. Accordingly, the TFT may be formed by adopting the flexible substrate 101 adopting a high molecular weight material.

A source region 104 and a drain region 105 are formed on the semiconductor active layer 103 by doping an N-type or a P-type ion impurity. A region between the source region 104 and the drain region 105 is a channel region 106 on which impurities are not doped. Alternatively, the semiconductor active layer 103 may be formed of an oxide semiconductor. For example, the oxide semiconductor may include an oxide of a material selected from group 12, group 13, and group 14 metallic elements, such as zinc (Zn), indium (In), gallium (Ga), tin (Sn), cadmium (Cd), germanium (Ge), and hafnium (Hf), and a compound thereof.

A gate insulating layer 107 is deposited on the semiconductor active layer 103. The gate insulating layer 107 includes an inorganic layer, such as silicon oxide, silicon nitride, and metal oxide, and is a single layer or stacked layers. A gate electrode 108 is formed in a pre-determined region of the gate insulating layer 107. The gate electrode 108 is electrically connected with a gate line (not shown) applying on and off signals of the TFT. The gate electrode 108 may include a single layer or stacked layers of gold (Au), silver (Ag), copper (Cu), nickel (Ni), platinum (Pt), palladium (Pd), aluminum (Al), molybdenum (Mo), and chromium (Cr), or may include an alloy, such as Al: neodymium (Nd), and Mo: tungsten (W). An interlayer insulating layer 109 is formed on the gate electrode 108. The interlayer insulating layer 109 may be formed of an insulating material, such as silicon oxide or silicon nitride, or alternatively, may be formed of an insulating organic layer.

A source electrode 110 and a drain electrode 111 are formed on the interlayer insulating layer 109. In detail, a contact hole is formed by selectively removing the gate insulating layer 107 and the interlayer insulating layer 109. Through the contact hole, the source electrode 110 is electrically connected to the source region 104, and the drain electrode 111 is electrically connected to the drain region 105. A passivation layer 112 is formed on the source electrode 110 and the drain electrode 111. The passivation layer 112 may be formed of an inorganic layer, such as silicon oxide or silicon nitride, or an organic layer. A planarization layer 113 is formed on the passivation layer 112. The planarization layer 113 includes an organic layer, such as acryl, polyimide, and benzocyclobutene (BCB).

The OLED may be formed on an upper portion of the TFT. To form the OLED, the first electrode 115 corresponding to a pixel electrode is electrically connected to any one of the source electrode 110 and the drain electrode 111, through the contact hole. Of the electrodes included in the OLED, the first electrode 115 serves a function as an anode, and may be formed of various conductive materials. The first electrode 115 may be formed of a transparent electrode or a reflection electrode, according to an object.

For example, when the first electrode 115 is formed of the transparent electrode, the first electrode 115 may include indium tin oxide (ITO), indium zinc oxide (IZO), zinc oxide (ZnO), and indium oxide ($In_2O_3$), and when the first electrode 115 is formed of the reflection electrode, ITO, IZO, ZnO, and $In_2O_3$ may be formed on an upper portion of a reflective layer after forming the reflective layer using Ag, Mg, Al, Pt, Pd, Au, Ni, Nd, Ir, Cr, and a compound thereof.

A pixel-defining layer (PDL) 114 is formed on the planarization layer 113 so as to cover a boundary of the first electrode 115 of the OLED. The pixel-defining layer 114 defines an emission region of each sub-pixel by surrounding the boundary of the first electrode 115. The pixel-defining layer 114 is formed of an organic layer material, or an inorganic layer material. For example, the pixel-defining layer 114 may be formed of an organic material, such as PI, polyamide (PA), BCB, acrylic resin, and phenol resin, or an inorganic material, such as SiNx. The pixel-defining layer 114 may be formed in various ways. For example, the pixel-defining layer 114 may be formed as a single layer or multiple layers.

An intermediate layer 116 is formed on a portion of the first electrode 115, which is exposed by etching a portion of the pixel-defining layer 114. The intermediate layer 116 may be formed by a deposition process. According to the present embodiment, the intermediate layer 116 is illustrated to be patterned to correspond only to each sub-pixel, that is, the first electrode 115 that is patterned, but this is only for convenience of explanation, and various other embodiments are possible. The intermediate layer 116 may be formed of a small molecular weight material or a high molecular weight material.

As illustrated in FIG. 2, when the intermediate layer 116 may be formed of the small molecular weight organic material, a hole injection layer (HIL) 118, a hole transport layer (HTL) 119, an emissive layer (EML) 120, an electron transport layer (ETL) 121, and an electron injection layer (EIL) 122 may be formed as a single layer or multiple layers, from the surface of the first electrode 115. The small molecular weight organic material may be formed by vapor deposition. When the intermediate layer 116 is formed of the high molecular weight organic material, the HTL, and the EML may be included. Poly(3,4-ethylenedioxythiophene)(PEDOT) may be used for the HTL, and a high molecular weight organic material, such as poly-phenylenevinylene (PPV) and polyfluorene, may be used for an emission layer. Here, screen printing or inkjet printing may be used to form the HTL and the emission layer.

Referring to FIG. 1 again, a second electrode 117 corresponding to a common electrode of the OLED may be formed on the intermediate layer 116. The second electrode 117 may be formed of a transparent electrode or a reflection electrode, like the first electrode 115. The first electrode 115 and the second electrode 117 are insulated from each other by the intermediate layer 116. If a voltage is applied to the first electrode 115 and the second electrode 117, visible light is emitted from the intermediate layer 116 so that an image that is recognizable to a user is formed. The second electrode 117 may be formed of a transparent electrode or a reflection electrode, like the first electrode 115. When the second electrode 117 is formed of the transparent electrode, a metal having a low work function, including lithium (Li), calcium (Ca), LiF/Ca, LiF/Al, Al, magnesium (Mg), and a compound thereof, is deposited on the intermediate layer 116, and above that, an electrode may be formed of a material for forming a transparent electrode, such as ITO, IZO, ZnO, and $In_2O_3$. When the second electrode 117 is formed of the reflection electrode, it is formed by depositing Li, Ca, LiF/Ca, LiF/Al, Al, Mg, and a compound thereof.

Meanwhile, when the first electrode 115 is formed of the transparent electrode or the reflection electrode, it may be formed to correspond to an opening shape of each sub-pixel. The second electrode 117 may be formed by depositing a transparent electrode or a reflection electrode in the entire area of a display region. Alternatively, the second electrode 117 may not necessarily be deposited in the entire area, but may be formed in various patterns. Also, the first electrode 115 and the second electrode 117 may be stacked in an opposite position to each other.

The encapsulation portion 130 is combined with an upper portion of the OLED. The encapsulation portion 130 is formed to protect the intermediate layer 116 or other thin films from external moisture and oxygen. The encapsulation portion 130 has a structure in which at least one organic layer and at least one inorganic layer are stacked. For example, the encapsulation portion 130 has a structure in which at least one organic layer 131 and 132, such as epoxy, polyimide, polyethylene ether phthalate, polycarbonate, polyethylene, and polyacrylate, and at least one inorganic layer 133, 134, and 135, such as $SiO_2$, SiNx, $Al_2O_3$, $TiO_2$, ZrOx, and ZnO, are stacked. The encapsulation portion 130 may have a structure in which at least one organic layer 131 and 132, and at least two inorganic layers 133, 134, and 135, are stacked.

Here, when fabricating the organic light-emitting display apparatus 100, a high energy laser beam is irradiated on the flexible substrate 101, in order to perform a dehydrogenation process or a crystallization process on the semiconductor active layer 103. Generally, low-temperature polycrystalline silicon (LTPS) requires a high temperature process of 450° C. at the least. When the laser beam is irradiated onto the semiconductor active layer 103, heat occurring on the surface of the semiconductor active layer 103 is transmitted to the flexible substrate 101. However, since the flexible substrate 101 is formed of a high molecular weight material, heat resistance of the flexible substrate 101 is low. For example, in a case where the flexible substrate 101 is formed of transparent polyimide, if the temperature transmitted to the flexible substrate 101 is the same or higher than 450° C., heat damage may occur. In other words, when the laser beam is irradiated onto the flexible substrate 101, the flexible substrate 101 may be damaged by heat, thus an outgassing phenomenon may occur on the flexible substrate 101, in a subsequent thermal process. Therefore, effective dispersion of energy that is generated by the laser beam is needed. For this, a plurality of barrier layers 102 and 125 are formed on the flexible substrate 101 and the thermal emission layer 124 is interposed between the plurality of barrier layers 102 and 125. Hereinafter, this aspect will be described in detail.

The thin film first barrier layers 102 and the thin film second barrier layers 125 are arranged on the flexible substrate 101, in a perpendicular direction to the flexible substrate 101, with gap distances therebetween. The first barrier layers 102 are formed so as to cover the flexible substrate 101. The second barrier layers 125 are formed by directly contacting the bottom surface of the semiconductor active layer 103. The first barrier layers 102 and the second barrier layers 125 include an inorganic layer. The first barrier layers 102 and the second barrier layers 125 have a structure in which, for each barrier layer, one or more layers are stacked. In addition, a plurality of the first barrier layers 102 and the second barrier layers 125 may be arranged in a perpendicular direction to the display apparatus 100, with a distance apart.

The thin film thermal emission layer 124 is interposed between the first barrier layers 102 and the second barrier layers 125. The bottom surface of the thermal emission layer 124 contacts the upper surface of the first barrier layers 102, and the upper surface of the thermal emission layer 125 contacts the bottom surface of the second barrier layers 125. Here, the first barrier layers 102 and the second barrier layers 125 are formed throughout the flexible substrate 101. The thermal emission layer 124 is formed to be at least the same size as the first barrier layers 102 and the second barrier layers 125. The thermal emission layer 124 includes heat conductive materials, for example, a transparent conductive layer or a metal thin film. Also, the thermal emission layer 124 may include a transparent oxide semiconductor.

When the thermal emission layer 124 is formed of a transparent conductive layer, the thermal emission layer 124 may include at least one selected from ITO, fluorine doped tin oxide (FTO), antimony tin oxide (ATO), and aluminum zinc oxide (AZO). When the thermal emission layer 124 is formed of a metal thin film, the thermal emission layer 124 may include a heat conductive metal material, such as Al or Cu.

When the thermal emission layer 124 is formed of a transparent oxide semiconductor, the thermal emission layer 124 may include indium gallium zinc oxide (IGZO).

As described above, according to the organic light-emitting display apparatus 100 according to an embodiment of the present disclosure, since the heat conductive thermal emission layer 124 is interposed between first barrier layers 102 and the second barrier layers 125, even if a high energy laser beam is irradiated onto the semiconductor active layer 103 for a dehydrogenation process or a crystallization process, the heat generated may easily be emitted externally by the thermal emission layer 124, thereby minimizing the heat damage to the flexible substrate 101.

Figure 3A:
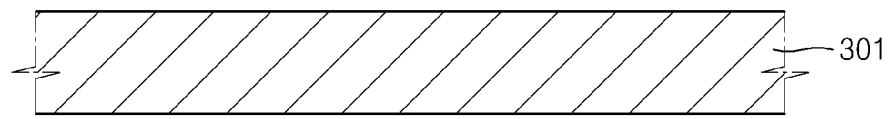
FIGS. 3A though 3K are cross-sectional views sequentially illustrating a process of fabricating the organic light-emitting display apparatus of FIG. 1.
Figure 4:
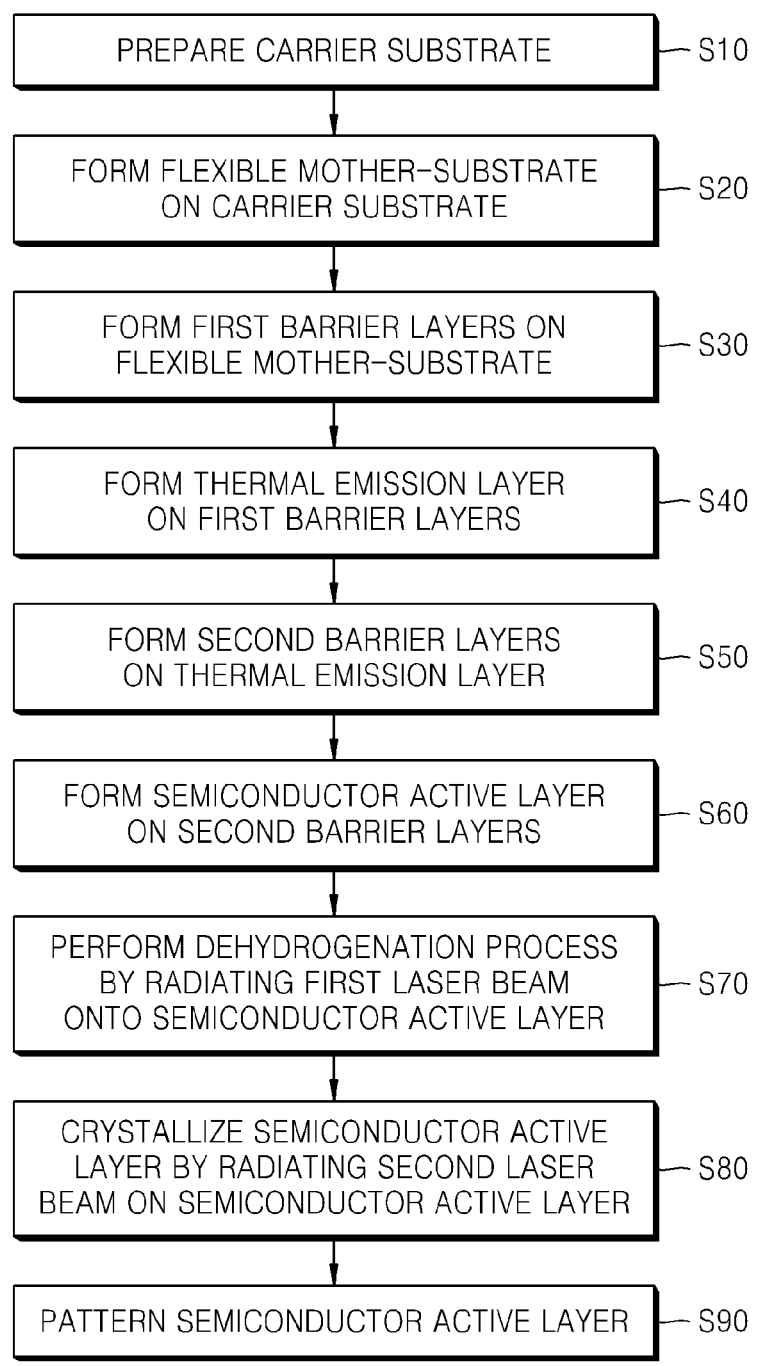
FIG. 4 is a flowchart sequentially illustrating a process of fabricating the organic light-emitting display apparatus of FIG. 1.

FIGS. 3A though 3K are cross-sectional views sequentially illustrating a process of fabricating the organic light-emitting display apparatus of FIG. 1. FIG. 4 is a flowchart sequentially illustrating a process of fabricating the organic light-emitting display apparatus of FIG. 1. Here, the organic light-emitting display apparatus 100 is to be implemented in individual unit display apparatuses, and, the fabrication method thereof, to be described later, refers to a process of fabricating the plurality of individual unit organic light-emitting display apparatuses 100, on one carrier substrate.

Referring to FIG. 3A, first, the carrier substrate 301 is prepared in operation S10. Since a flexible organic light-emitting display apparatus 100 is fabricated using a flexible material, the flexible organic light-emitting display apparatus tends to be bent or dragged, when a certain amount of heat is applied. Accordingly, it is hard to form various electrodes or thin film patterns including conductive wirings, accurately on the flexible substrate. Therefore, a substrate having rigidity, for example, a thick film glass substrate is used as a support substrate.

Figure 3B:
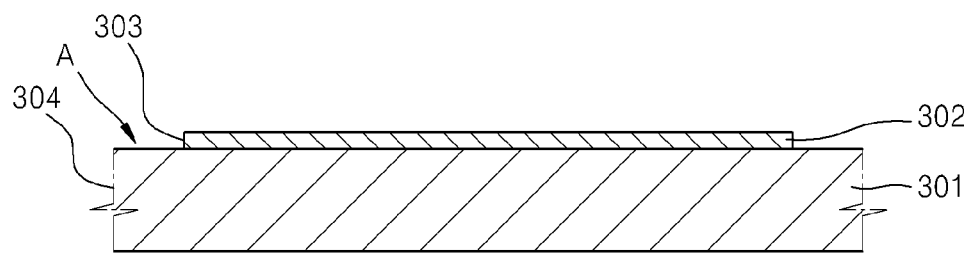
FIG. 3B is a cross-sectional view illustrating a state after a flexible mother-substrate is formed on the carrier substrate of FIG. 3A.

Next, referring to FIG. 3B, a flexible mother-substrate 302 is formed in operation S20 on the carrier substrate 301. The flexible mother-substrate 302 is formed to have a size sufficient for covering a formation of a plurality of the individual organic light-emitting display apparatuses 100. The flexible mother-substrate 302 is formed of a high molecular weight material having flexibility. The flexible mother-substrate 302 may be formed of PI, PC, PES, PET, PEN, PAR, or FRP. The flexible mother-substrate 302 is formed as a thin film substrate by coating and hardening a high molecular weight material on the carrier substrate 301. The hardening methods may include methods using heat, ultraviolet (UV), or an electronic beam. Alternatively, the flexible mother-substrate 302 may be formed by laminating a high molecular weight film on the carrier substrate 301. Meanwhile, the flexible mother-substrate 302 may be transparent, semi-transparent, or non-transparent. The flexible mother-substrate 302 according to the present embodiment is a transparent substrate, in order to fabricate a transparent flexible display apparatus. Here, a region A from a boundary 303 of the flexible mother-substrate 302 to a boundary 304 of the carrier substrate 301 is exposed externally. The region A is a margin of the carrier substrate 310.

Figure 3C:
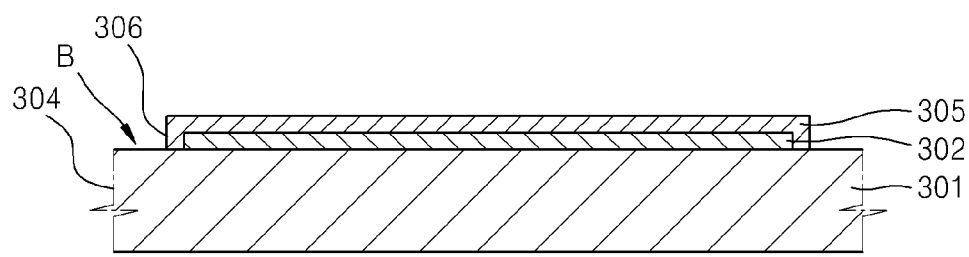
FIG. 3C is a cross-sectional view illustrating a state after first barrier layers are formed on the flexible mother-substrate of FIG. 3B.

Subsequently, as illustrated in FIG. 3C, the first barrier layers 305 are formed in operation S30 on the flexible mother-substrate 302. The first barrier layers 305 are formed so as to entirely cover the flexible mother-substrate 302. The first barrier layers 305 include an inorganic layer. The first barrier layers 305 are formed of at least one selected from SiOx, SiNx, SiON, AlO, and AlON. The first barrier layers 305 may be formed as a single layer or multiple layers by chemical vapor deposition (CVD), plasma enhanced chemical vapor deposition (PECVD), or atomic layer deposition (ALD), by using the inorganic material. Here, a region B from a boundary 306 of the first barrier layers 305 to the boundary 304 of the carrier substrate 301 is exposed externally. The region B corresponds to a thermal emission region. The region B is formed in a square band shape, circumscribing the first barrier layers 305, but it is not limited thereto. The region B from the boundary 306 of the first barrier layers 305 to the boundary 304 of the carrier substrate 301 is formed narrower than the region A from the boundary 303 of the flexible mother-substrate 302 to the boundary 304 of the carrier substrate 301.

Figure 3D:
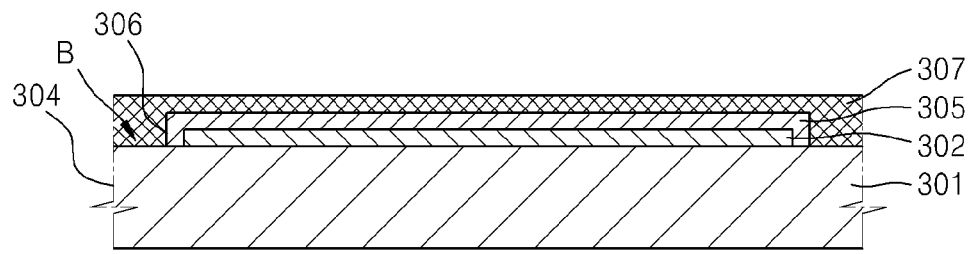
FIG. 3D is a cross-sectional view illustrating a state after a thermal emission layer is formed on the barrier layers of FIG. 3C.

Next, referring to FIG. 3D, the thermal emission layer 307 is formed in operation S40 on the first barrier layers 305. The thermal emission layer 307 entirely covers the first barrier layers 305. For this, the thermal emission layer 307 is formed wider than the first barrier layers 305. The thermal emission layer 307 extends from an upper portion of the first barrier layers 305 to the thermal emission region B. Also, the thermal emission layer 307 entirely covers the thermal emission region B from the boundary 306 of the first barrier layers 305 to the boundary 304 of the carrier substrate 301. The thermal emission layer 307 is formed on the first barrier layers 305 by CVD, PECVD, or ALD, using a transparent conductive layer or a material for a metal thin film, which are materials having high heat conductivity. Alternatively, the thermal emission layer 307 may be formed of a transparent oxide semiconductor. When the thermal emission layer 307 is formed of a transparent conductive layer, any one selected from ITO, FTO, ATO, and AZO may be used to form a thin film on the first barrier layers 305. When the thermal emission layer 307 is formed of a metal thin film, a metal material having high heat conductivity, such as Al or Cu, may be used to form the thin film on the first barrier layers 305. When the thermal emission layer 307 is a metal thin film, to obtain pre-determined transparency, the thickness of the upper portion of the first barrier layers 305 and the thickness of the metal thin film of the thermal emission region B may be different from each other. When the thermal emission layer 307 is formed of a transparent oxide semiconductor, IGZO may be used to form a thin film on the first barrier layers 305.

Figure 3E:
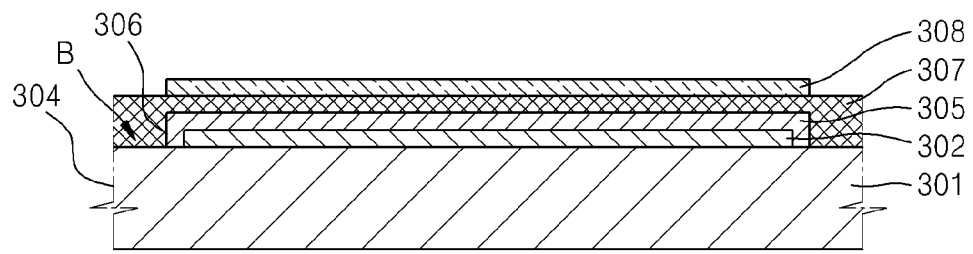
FIG. 3E is a cross-sectional view illustrating a state after second barrier layers are formed on the thermal emission layer of FIG. 3D.

Next, referring to FIG. 3E, the second barrier layers 308 are formed in operation S50 on the thermal emission layer 307. The second barrier layers 308 may be formed to have the same size as the first barrier layers 305. The second barrier layers 307 may be formed as a single layer or multiple layers by using the same material as the first barrier layers 305.

Figure 3F:
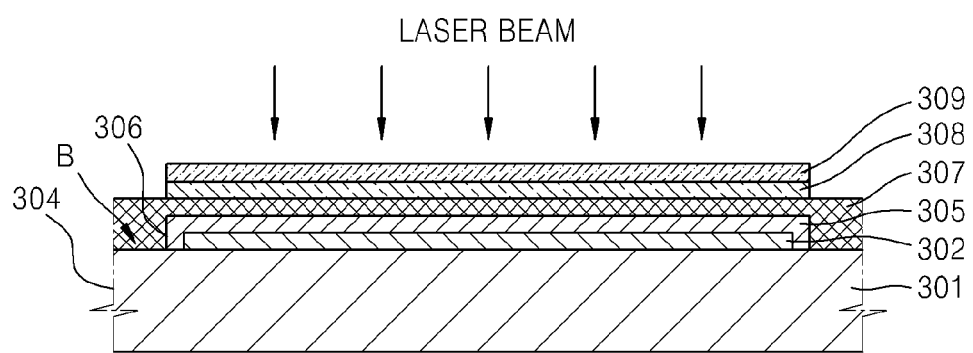
FIG. 3F is a cross-sectional view illustrating a state in which a laser beam is irradiated on a semiconductor active layer, after the semiconductor active layer is formed on the second barrier layers of FIG. 3E.

Next, referring to FIG. 3F, the semiconductor active layer 309 is formed in operation S60 on the second barrier layers 308. Following that, amorphous silicon is formed on the barrier layers 309. Amorphous silicon is deposited, and a dehydrogenation process is performed in operation S70 by a laser. Hydrogen (H) contained in the semiconductor active layer 309 is removed by irradiating a first laser beam onto the semiconductor active layer 309 that is not patterned. For example, the first laser shot is to be irradiated about 20 times onto the semiconductor active layer 309, at an intensity of between about 280 through about 320 $mJ/cm^2$. Next, the semiconductor active layer 309 is crystallized in operation S80 by irradiating a second laser beam onto the semiconductor active layer 309 that is dehydrogenated. For example, the second laser shot is to be irradiated about 40 times onto the semiconductor active layer 309, at an intensity of between about 430 through about 470 $mJ/cm^2$.

Like this, before patterning the semiconductor active layer 309, the first laser shot is irradiated as part of the hydrogenation process of the semiconductor active layer 309, and following this, the second laser shot having a higher energy than the first laser shot is irradiated as part of the crystallization process. Here, on the surface of the semiconductor active layer 309, the temperature rises to a high temperature, for example, about 1500° C., due to an effect of the laser beam, and thus, a deformation of the flexible mother-substrate 301, which has poor heat resistance, may occur, due to heat. To prevent this, the thermal emission layer 307 having high heat conductivity is formed between the first barrier layers 305 and the second barrier layers 308. Thus, the heat generated by the laser beam is transmitted to a boundary of the thermal emission layer 307, and quickly emitted externally through the thermal emission region B from the boundary 306 of the first barrier layers 305 to the boundary 304 of the carrier substrate 301. Therefore, the heat transmitted to the flexible mother-substrate 301 may be minimized so that the damage to the flexible mother-substrate may be reduced. Following this, the semiconductor active layer 309 is patterned in operation S90.

Figure 3G:
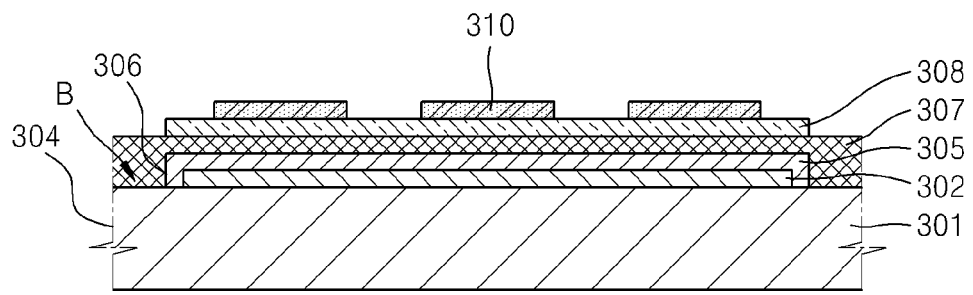
FIG. 3G is a cross-sectional view illustrating a state after a thin film transistor (TFT) is patterned on the flexible mother-substrate of FIG. 3F.

Next, as shown in FIG. 3G, after the dehydrogenation process, the crystallization process, and the patterning process of the semiconductor active layer 309, the TFT 310 is formed on the flexible mother-substrate 301. The TFT 310 includes not only the semiconductor active layer 309, but also the patterns formed by a photolithography process, after depositing the gate electrode, the source electrode, the drain electrode, a capacitor, and various wirings by CVD, PECVD, and ALD.

Figure 3H:
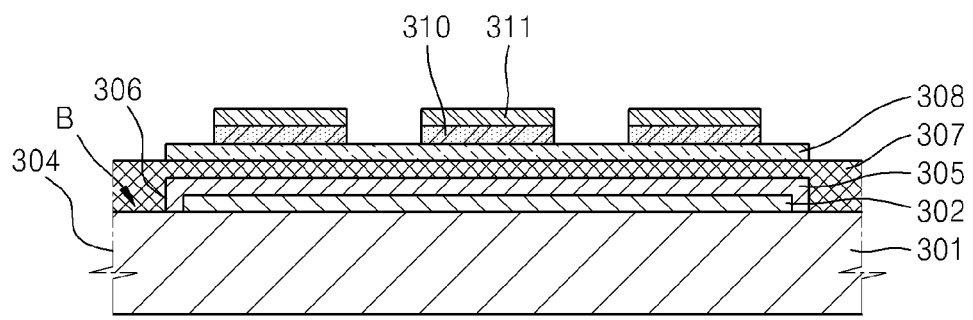
FIG. 3H is a cross-sectional view illustrating a state after an organic light-emitting device (OLED) is patterned on the TFT of FIG. 3G.

Following this, as shown in FIG. 3H, on the TFT 310, the OLED 311 including an organic emission layer is formed by various methods including deposition, coating, printing, and light-thermal transferring.

Figure 3I:
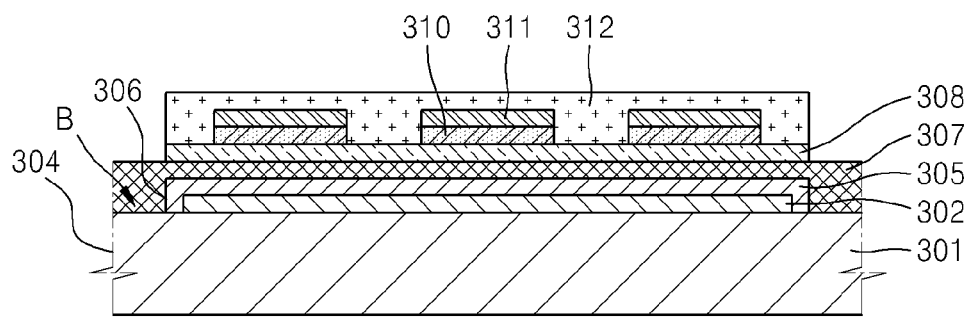
FIG. 3I is a cross-sectional view illustrating a state after an encapsulation portion is formed on a flexible mother-substrate of FIG. 3H.

Next, as shown in FIG. 3I, the thin film encapsulation portion 312, encapsulating the entire plurality of OLEDs 312, which are patterned together, is formed on the flexible mother-substrate 301. Although not shown, the encapsulation portion 312 may stack at least one organic layer and at least one inorganic layer, alternately. There may be a plurality of organic or inorganic layers. The organic layer is formed as a polymer, and may be a single layer or stacked layers formed of any of polyethylene ether phthalate, polyimide (PI), polycarbonate (PC), epoxy, polyethylene, and polyacrylate (PAR). The organic layer may be formed of polyacrylate (PAR), and more particularly, may include a polymerized monomer composition including a diacrylate monomer and a triacrylate monomer. The monomer composition may further include a monoacrylate monomer. Also, the monomer composition may further include a photoinitiator that is well known to those of ordinary skill in the art, such as thermoplastic polyolefin (TPO), but it is not limited thereto. The inorganic layer may be a single layer or stacked layers including metal oxide or metal nitride. Particularly, the inorganic layer may include any of SiNx, $Al_2O_3$, $SiO_2$, and $TiO_2$.

A top portion exposed externally to the encapsulation portion 312 may be formed of an inorganic layer to waterproof the OLED 311. The encapsulation portion 312 may include at least one sandwich structure in which at least one organic layer is inserted between at least two inorganic layers. Also, the encapsulation portion 312 may include at least one sandwich structure in which at least one inorganic layer is inserted between at least two organic layers. The encapsulation portion 312 may sequentially include a first inorganic layer, a first organic layer, and a second inorganic layer from the top of the OLED 311. Also, the encapsulation portion 312 may sequentially include a first inorganic layer, a first organic layer, a second inorganic layer, a second organic layer, and a third inorganic layer from the top of the OLED 311. Also, the encapsulation portion 312 may sequentially include a first inorganic layer, a first organic layer, a second inorganic layer, a second organic layer, a third inorganic layer, a third organic layer, and a fourth inorganic layer from the top of the OLED 311. A halogenated metal layer, including LiF, may further be included between the OLED 311 and the first inorganic layer. The halogenated metal layer may prevent the OLED 311 from being damaged when forming the first inorganic layer by sputtering or plasma deposition.

The first organic layer may have a smaller area than the second inorganic layer, and the second organic layer may have a smaller area than the third inorganic layer. Also, the first organic layer may be completely covered by the second inorganic layer, and the second organic layer may be completely covered by the third inorganic layer.

Meanwhile, FIG. 3I illustrates that a plurality of individual unit organic light-emitting display apparatuses (100 of FIG. 1) are commonly covered by the one encapsulation portion 311, but embodiments of the present disclosure are not limited thereto. In other words, the encapsulation portion 311 may individually cover the OLED 311.

Figure 3J:
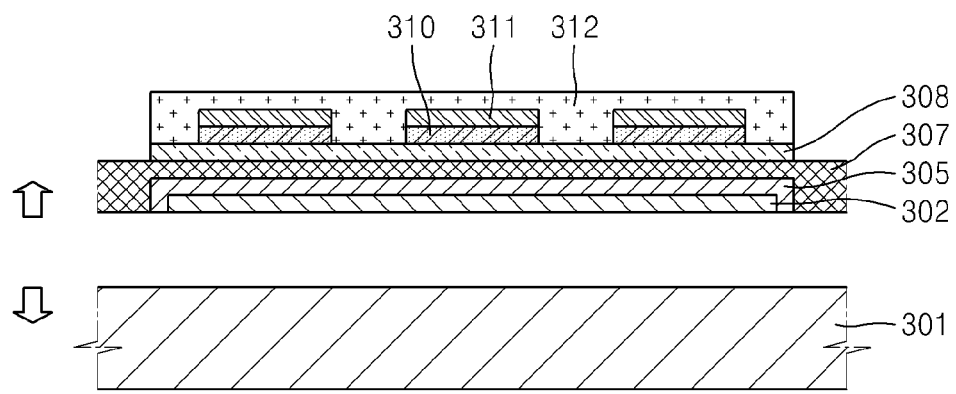
FIG. 3J is a cross-sectional view illustrating a state in which a carrier substrate and the flexible mother-substrate of FIG. 3I are separated.

Following this, as shown in FIG. 3J, the flexible mother-substrate 302 is separated from the carrier substrate 301. That is, a laser beam is irradiated to the opposite surface of the surface of the carrier substrate 301 on which the flexible mother-substrate 302 is formed, so that the combining power of the carrier substrate 301 and the flexible mother-substrate 302 is weakened. Then, certain tension is applied from an outside, so that the flexible mother-substrate 302 is separated from the carrier substrate 301. Meanwhile, in the process of separating the flexible mother-substrate 302 from the carrier substrate 301, a protective film may be attached to the encapsulation portion 312. For the protective film, an optical member, such as a polarized film, may be used.

Figure 3K:
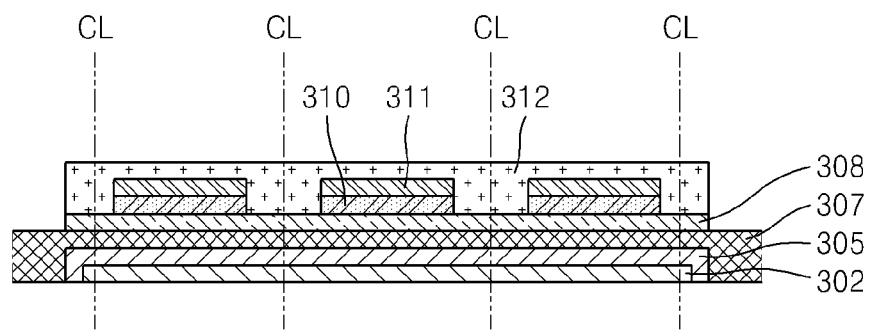
FIG. 3K is a cross-sectional view illustrating a state in which a plurality of organic light-emitting display apparatuses of FIG. 3J are divided into individual units.

Next, as shown in FIG. 3K, the organic light-emitting display apparatuses may be divided into an individual organic light-emitting display apparatus, by cutting along the cutting line CL of a non-indicated region between the individual display apparatuses, by using a cutting wheel, or a laser cutting machine. Like this, when fabricating the flexible organic light-emitting display apparatus, by forming the thermal emission layer 307 between the plurality of the first barrier layers 305 and the second barrier layers 308, the heat generated by the energy arising from the performing of the dehydrogenation process or the crystallization process of the semiconductor active layer 309, is transmitted to the outside so that the damage to the flexible mother-substrate 302 may be minimized.

FIG. 4 is a flowchart sequentially illustrating a process of fabricating the organic light-emitting display apparatus of FIG. 1.

Figure 5:
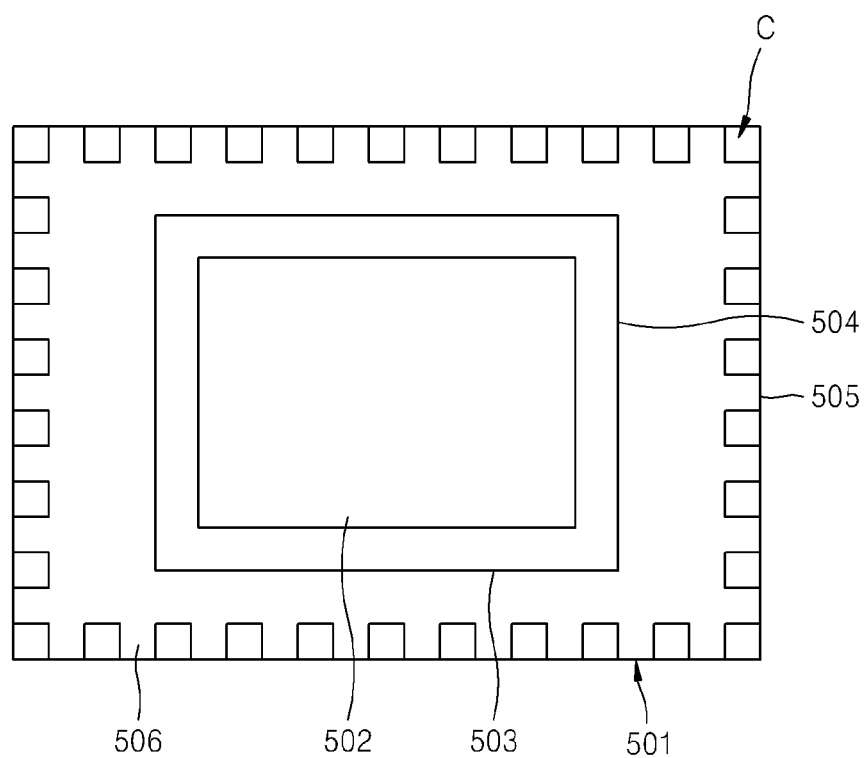
FIG. 5 is a cross-sectional view illustrating a shape of a thermal emission layer according to another embodiment.

FIG. 5 is a cross-sectional view illustrating a shape of a thermal emission layer according to another embodiment of the present disclosure. Referring to FIG. 5, the flexible mother-substrate 502 is formed on the carrier substrate 501. The flexible mother-substrate 502 is covered by the barrier layers 503. The barrier layers 503 include an inorganic layer. A region C between the boundary 504 of the barrier layers 503 and the boundary 505 of the carrier substrate 501 is the thermal emission region exposed externally. The thermal emission layer 506 is formed on the barrier layers 504. The thermal emission layer 506 is formed wider than the barrier layers 503. The thermal emission layer 506 extends from an upper portion of the barrier layers 503 to the thermal emission region C. Here, unlike the thermal emission layer 307 of FIG. 3D, the thermal emission layer 506 according to the present embodiment is formed as a certain pattern in the thermal emission region C, to enlarge a surface area in which the light is emitted. According to the present embodiment, the thermal emission layer 506 is formed in a concavo-convex shape. However, if, because the thermal emission layer 506 is not formed in a portion of the thermal emission region C, the structure allows the enlargement of the surface area, various shapes, such as a wave shape, a mesh shape, and a zig-zag shape, may be possible. Meanwhile, the heat transmitted to the flexible mother-substrate 502 may be reduced by increasing the number of the barrier layers 504 and the thermal emission layers 506.

As described above, according to the one or more of the above embodiments of the present disclosure, the thermal emission layer is interposed between the plurality of barrier layers, thereby minimizing heat damage to the flexible substrate, when irradiating a laser onto the semiconductor active layer.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present invention as defined by the following claims.

What is claimed is:

1. An organic light-emitting display apparatus, comprising:
   a flexible substrate;
   a plurality of barrier layers formed on the flexible substrate;
   a thin film transistor (TFT) formed on the barrier layers, including a semiconductor active layer;
   at least one thermal emission layer formed between the barrier layers;
   an organic light-emitting device (OLED) formed on the barrier layers, electrically connected to the TFT; and
   an encapsulation portion encapsulating the OLED.

2. The organic light-emitting display apparatus of claim 1, wherein the at least one thermal emission layer includes a transparent conductive layer.

3. The organic light-emitting display apparatus of claim 1, wherein the at least one thermal emission layer includes a transparent oxide semiconductor.

4. The organic light-emitting display apparatus of claim 1, wherein the at least one thermal emission layer includes a metal thin film.

5. The organic light-emitting display apparatus of claim 1, wherein the plurality of barrier layers are formed in a perpendicular direction to the flexible substrate, with gap distances therebetween, and the at least one thermal emission layer is interposed between the gap distances between the barrier layers.

6. The organic light-emitting display apparatus of claim 5, wherein the barrier layers contact the thermal emission layer.

7. The organic light-emitting display apparatus of claim 5, wherein the barrier layers are formed over an entire area of the flexible substrate, and wherein the at least one thermal emission layer has at least the same size as the barrier layers.

8. The organic light-emitting display apparatus of claim 1, wherein the flexible substrate is formed of a transparent material.

9. The organic light-emitting display apparatus of claim 1, wherein the barrier layers include an inorganic layer.

* * * * *